(12) United States Patent
Verma et al.

(10) Patent No.: US 7,986,166 B1
(45) Date of Patent: Jul. 26, 2011

(54) CLOCK BUFFER CIRCUIT

(75) Inventors: Chetan Verma, Noida (IN); Nitin Verma, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/685,681

(22) Filed: Jan. 12, 2010

(51) Int. Cl.
*H03K 19/096* (2006.01)

(52) U.S. Cl. .......................................... 326/95; 326/98

(58) Field of Classification Search .................... 326/93, 326/95, 98
See application file for complete search history.

(56) References Cited

U.S. PATENT DOCUMENTS

| | | | |
|---|---|---|---|
| 5,051,625 A * | 9/1991 | Ikeda et al. | 326/27 |
| 5,583,457 A * | 12/1996 | Horiguchi et al. | 326/121 |
| 5,614,847 A * | 3/1997 | Kawahara et al. | 326/98 |
| 5,952,951 A * | 9/1999 | Fujino | 341/159 |
| 6,100,726 A | 8/2000 | Nayebi | |
| 6,140,836 A * | 10/2000 | Fujii et al. | 326/35 |
| 6,307,236 B1 * | 10/2001 | Matsuzaki et al. | 257/392 |
| 6,359,489 B1 | 3/2002 | Huang | |
| 6,861,878 B2 * | 3/2005 | Haruhana et al. | 327/77 |
| 7,227,383 B2 | 6/2007 | Hoberman | |
| 7,237,163 B2 | 6/2007 | Dhong | |
| 7,327,993 B2 | 2/2008 | Khlat | |
| 7,560,976 B2 * | 7/2009 | Choi et al. | 327/534 |
| 2002/0008999 A1 * | 1/2002 | Hidaka | 365/200 |
| 2006/0145726 A1 * | 7/2006 | Hidaka | 326/98 |
| 2006/0220722 A1 * | 10/2006 | Komura et al. | 327/291 |
| 2008/0238510 A1 | 10/2008 | Aksamit | |
| 2009/0199038 A1 | 8/2009 | Sigal | |
| 2009/0237164 A1 | 9/2009 | Kase | |

OTHER PUBLICATIONS

Kawaguchi, Hiroshi et al., A CMOS Scheme for 0.5V Supply Voltage with Pico-Ampere Standby Current, ISSCC98/Session 12/TD: Low Voltage and Multi-Level Techniques/Paper FP 12.4, Feb. 6, 1998.
Bhunia, Swarup et al., A Novel Synthesis Approach for Active Leakage Power Reduction Using Dynamic Supply Gating, DAC 2005, Jun. 13-17, 2005.

* cited by examiner

*Primary Examiner* — Jason M Crawford
(74) *Attorney, Agent, or Firm* — Charles Bergere

(57) ABSTRACT

A clock buffer for a clock network that reduces leakage current and lowers power consumption. The clock buffer includes a first CMOS transistor, a second CMOS transistor, and a leakage current prevention circuit connected to the first and second CMOS transistors. The leakage current prevention circuit includes a first PMOS transistor, which is connected between the source of a PMOS transistor of the first CMOS transistor and a power supply line, and a second PMOS transistor, which is connected between the source of a PMOS transistor of the second CMOS transistor and the power supply line. The first and second PMOS transistors are deactivated in response to an enable signal generated when a circuit block does not require the clock signal. The first and the second PMOS transistors have predefined widths and lengths such that the addition of these transistors in series with the CMOS transistors does not increase the propagation delay of the clock buffer circuit. Deactivating the first and second PMOS transistors disconnects the CMOS transistors from the power supply line, which prevents current leakage.

4 Claims, 1 Drawing Sheet

CLOCK BUFFER CIRCUIT

BACKGROUND OF THE INVENTION

The present invention relates to a clock network of an integrated circuit, and more particularly, to a clock buffer circuit for a clock network.

An integrated circuit (IC) includes a plurality of internal circuits that receive a clock signal and operate in synchronism with the clock signal. Each internal circuit receives the clock signal via one or more clock buffers. However, there is a limit to the number of internal circuits that can be operated by a clock signal originating from a single clock buffer. Additionally, to meet the timing of the circuit, it is essential to keep the clock latency and skew (between different internal circuits receiving the clock inputs), within prescribed limits. Thus, to provide the clock signal to a plurality of internal circuits, the IC includes a plurality of clock networks, each including a plurality of clock buffers.

The recent tendency for the use of more internal circuits has increased the number of clock buffers in a clock network. However, as is well known, clock buffers slow down the clock signal and contribute to the problem of clock skew. Thus, there is a demand for faster clock buffers. To increase the speed of a clock buffer circuit, faster transistors can be used to form the circuit, such as low voltage threshold (LVT) transistors. However, LVT transistors increase power consumption and their use is thus in conflict with today's demands for low power circuits.

Thus, it would be desirable to have a low power but fast clock buffer circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

Figure 2:
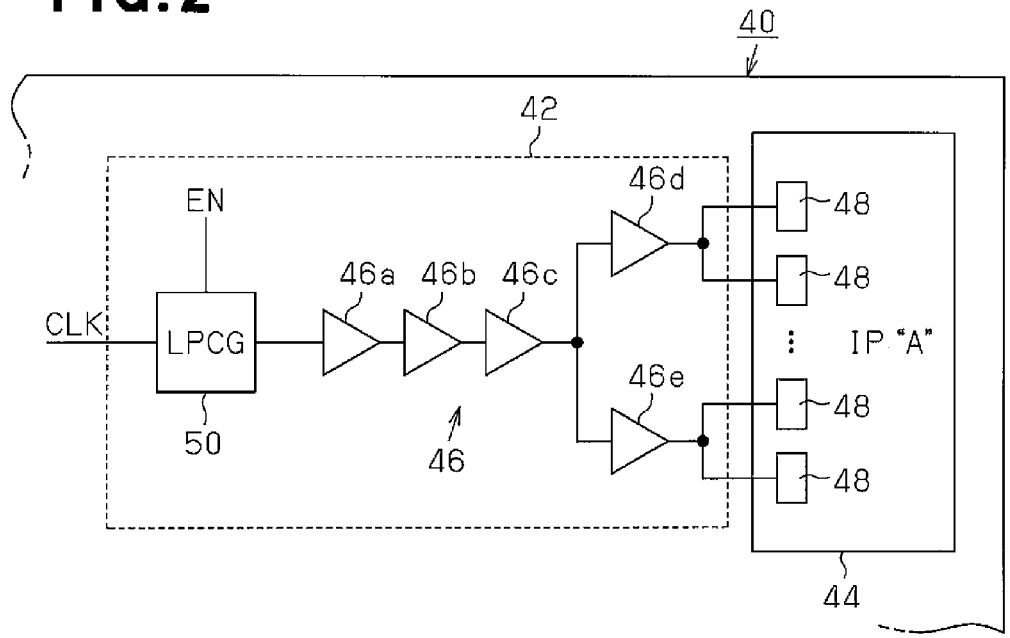
FIG. 2 is a schematic circuit diagram showing a clock network incorporating the clock buffer circuits of FIG. 1 in a semiconductor integrated circuit device.

The terms "assert" or "set" and "negate" (or "de-assert" or "clear") are used herein when referring to the rendering of a signal into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a forward slash (/) preceding the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The present invention provides a low power and low leakage clock buffer circuit for use in a clock network of a semiconductor integrated circuit. In one embodiment, the present invention is a clock buffer circuit including a first CMOS transistor connected between a power supply line and a ground line. A second CMOS transistor is connected to the first CMOS transistor, and also connected between the power supply line and the ground line. A first PMOS transistor is connected between a source of a PMOS transistor in the first CMOS transistor and the power supply line. A gate of the first PMOS transistor receives an enable signal. A second PMOS transistor is connected between a source of a PMOS transistor in the second CMOS transistor and the power supply line, and a gate of the second PMOS transistor receives the enable signal. The first and second PMOS transistors are deactivated in response to the enable signal, which disconnects the first and second CMOS transistors from the power supply line.

In another embodiment, in an integrated circuit having a plurality of internal circuit blocks, the present invention provides a clock network for providing a clock signal to the plurality of internal circuit blocks. The clock network includes a plurality of clock buffer circuits that sequentially receive and output a clock signal to the plurality of internal circuits. Each of the plurality of clock buffer circuits includes a first CMOS transistor connected between a power supply line and a ground line, and a second CMOS transistor connected between the power supply line and the ground line, and also connected to the first CMOS transistor. A first switch is connected between a source of a PMOS transistor of the first CMOS transistor and the power supply line. A second switch is connected between a source of a PMOS transistor of the second CMOS transistor and the power supply line. The first and second switches are deactivated in response to an enable signal that is generated when the circuit block to which the clock buffer circuit is connected does not require the clock signal. Deactivating the first and second switches disconnects the first and second CMOS transistors from the power supply line.

In yet another embodiment, the present invention provides a clock buffer circuit for use in a clock network. The clock buffer circuit includes a clock driver circuit and a leakage current prevention circuit. The clock driver circuits includes a first CMOS transistor connected between a power supply line and a ground line, and a second CMOS transistor connected to the first CMOS transistor and also connected between the power supply line and the ground line. The leakage current prevention circuit disconnects the first and second CMOS transistors from the power supply line. In one embodiment, the leakage current prevention circuit includes a first PMOS transistor connected between a source of a PMOS transistor in the first CMOS transistor and the power supply line. A gate of the first PMOS transistor receives an enable signal. The leakage current prevention circuit also includes a second PMOS transistor connected between a source of a PMOS transistor in the second CMOS transistor and the power supply line. A gate of the second PMOS transistor receives the enable signal. The first and second PMOS transistors are deactivated in response to the enable signal, which disconnects the first and second CMOS transistors from the power supply line, which prevents the first and second CMOS transistors from leaking.

Other aspects and advantages of the present invention will become apparent from the following description, taken in conjunction with the accompanying drawings, illustrating by way of example the principles of the invention. A preferred embodiment of the present invention will now be discussed with reference to FIG. 1.

Figure 1:
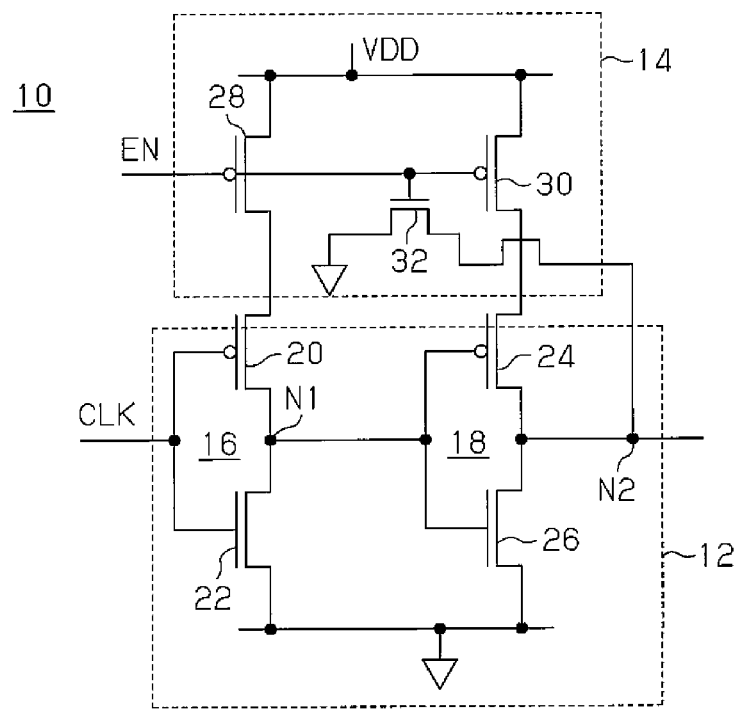
FIG. 1 is a schematic circuit diagram of a clock buffer circuit according to an embodiment of the present invention.

FIG. 1 is a schematic circuit diagram of a clock buffer circuit 10 in accordance with an embodiment of the present invention. The clock buffer circuit 10 includes a clock driver circuit 12 and a leakage current prevention circuit 14. As shown in FIG. 1, each of the clock driver circuits includes a first CMOS transistor 16 and a second CMOS transistor 18. The first CMOS transistor 16 and the second CMOS transistor 18 are connected between a power supply line (VDD) and a ground line (GND), and in series with each other.

The first CMOS transistor 16 includes a PMOS transistor 20 connected in series with an NMOS transistor 22, as is well known to those skilled in the art. The PMOS transistor 20 has a source connected to a power supply line (VDD), a drain connected to the drain of the NMOS transistor 22, and a gate connected to an input terminal of the clock buffer circuit 10, which is an input clock line CLK. The source of the NMOS transistor 22 is connected to a ground line (GND) and the gate of the NMOS transistor 22 is connected the input clock line CLK.

The second CMOS transistor 18 includes a PMOS transistor 24 connected in series with an NMOS transistor 26. The PMOS transistor 24 has a source connected to the power supply line (VDD), a drain connected to the drain of the NMOS transistor 26, and a gate connected to a node N1 between the drains of the PMOS transistor 20 and the NMOS transistor 22 of the first CMOS transistor 16. The source of the NMOS transistor 26 is connected to the ground line (GND) and the gate of the NMOS transistor 26 is connected the node N1. Thus, as shown, the gates of the PMOS transistors 20 and 24 and the gates of the NMOS transistors 22 and 26 are all connected together. The drains of the PMOS transistor 24 and the NMOS transistor 26 are connected to each other at a node N2, which is an output of the clock buffer circuit 12.

The leakage current prevention circuit 14 is provided for disconnecting the first and second CMOS transistors from the power supply line. In one embodiment, the leakage current prevention circuit includes a first switch or power supply blocking transistor 28 and a second switch or second power supply blocking transistor 30.

The first power supply blocking transistor 28 is formed from a PMOS transistor and is connected between the first CMOS transistor 16 (i.e., the source of the PMOS transistor 20) and the power supply line VDD. The second power supply blocking transistor 30 also is formed from a PMOS transistor and is connected between the second CMOS transistor 18 (i.e., the source of the PMOS transistor 24) and the power supply line VDD. The first and second power supply blocking transistors 28 and 30 have pre-defined widths and lengths that are chosen such that the propagation delay of the clock circuit 12 is not affected by the inclusion of the leakage current prevention circuit 14.

The gates of the first and second power supply blocking transistors 28 and 30 each receive an enable signal EN. The enable signal EN can be provided from another circuit block of the integrated circuit. In one embodiment, the enable signal is a low active signal. Thus, when the gates of the first and second power supply blocking transistors 28 and 30 receive a low enable signal EN, the two transistors 28 and 30 are activated, which closes the path between the power supply line VDD and the CMOS transistors 16 and 18, so the first and second CMOS transistors 16 and 18 receive power supply voltage VDD.

On the other hand, when the gates of the first and second power supply blocking transistors 28 and 30 receive a high enable signal EN, the two transistors 28 and 30 are deactivated, which blocks the supply of power supply voltage VDD to the first and second CMOS transistors 16 and 18. When the supply voltage VDD is not applied to the first and second CMOS transistors 16 and 18, there is no leakage current produced from the first and second CMOS transistors 16 and 18. That is, there is no potential difference between the source and gate of the activated one of the MOS transistors. Further, there is no potential difference between the source and drain of the deactivated one of the MOS transistors. Since there is no section that has a potential difference, leakage current is not produced.

Leakage current is produced in the following manner. With CMOS transistors, in the activated one of the MOS transistors, a channel is formed and a source-gate potential difference is produced. In the deactivated one of the MOS transistors, a channel is inactive and a source-drain potential difference is produced. In the sections in which the two potential differences are produced, the potential difference results in the flow of leakage current. In other words, gate leakage current flows in a section in which a potential difference is produced between the source and gate, and off current flows in a section in which a potential difference is produced between the source and drain.

The clock buffer circuit 10 may be formed using high threshold voltage (HVT) cells. As is known by those skilled in the art, the use of HVT cells provides for less power loss, although with slower switching speed than when a circuit is formed using low threshold voltage (LVT) or standard threshold voltage (SVT) cells. One trade-off being that LVT and SVT cells consume more power. When forming the clock buffer circuit 10 from cells having a threshold voltage set at a low potential (i.e., SVT or LVT cells), under a high temperature (105° C.), the leakage current would be nearly twenty times greater than that when the clock buffer circuit 10 is formed from cells having a threshold voltage set at a high potential such as a high voltage threshold (HVT) cell. Additionally, if the clock buffer circuit 10 were formed from LVT cells having a narrow line width and a threshold voltage set at a low potential, the leakage current would further increase. Thus, in the presently preferred embodiment, the clock buffer circuit is formed using HVT cells. Even so, the clock buffer circuit 10 has a high operation speed, one which is nearly the same as the operation speed when forming a clock buffer from LVT cells. In addition, as discussed above, the clock buffer circuit 10 reduces leakage current considerably.

In one embodiment of the invention, the leakage current prevention circuit 14 includes an output stabilization holding transistor 32, which is formed from an NMOS transistor. The output stabilization holding transistor 32 has a drain connected to the output terminal of the clock driver circuit 12 at the node N2, a source connected to the ground line GND, and a gate that receives the enable signal EN in the same manner as the first and second power supply blocking transistors 28 and 30.

Preferably, the output stabilization holding transistor 32 has a small size and a small driving capacity. When the gate of the output stabilization holding transistor 32 receives a high enable signal EN, the transistor 32 is activated so that the node N2 is held at ground level GND. That is, when blocking the supply of voltage VDD to the first and second CMOS transistors 16 and 18, the output level of the clock buffer circuit 10 is held at the ground GND level so as not to shift to a floating state. This prevents the output level of the clock buffer circuit 10 from suddenly changing when the supply voltage VDD is blocked and thereby prevents erroneous operation of the circuits connected to the output of clock buffer circuit 10 and receive their input signal from clock circuit 10.

When the gate of the output stabilization holding transistor 32 receives a low enable signal EN, the transistor 32 is deactivated. Thus, when the first and second CMOS transistors 16 and 18 are provided with the supply voltage VDD, the clock signal CLK is output from the clock buffer circuit at the output terminal (node N2).

Referring now to FIG. 2, a schematic block diagram of a semiconductor integrated circuit (IC) 40 having a low leakage clock network 42 and multiple circuit blocks 44 (only one is shown here) is shown. A clock signal CLK is received by the clock network 42, buffered, and then output to the circuit blocks 44. The circuit blocks 44 can be predefined circuit blocks, often referred to by designers as IPs, which means the blocks or IPs can be taken from one IC and used in another IC. That is, the circuit blocks 44 can be stand-alone circuits that can be re-used by other designers for other designs, such as system-on-chip (SOC) ICs.

In one embodiment of the invention, the clock network comprises a plurality of series connected clock circuit buffers 46. Individual buffers 46a-46e are shown, however, as will be understood by those skilled in the art, the clock network 42 could contain more or fewer clock circuit buffers 46. The clock circuit buffers 46 preferably have a circuit structure like the buffer circuit 10 shown in FIG. 1 and described above. The circuit blocks 44 include a plurality of internal circuit elements, such as latches 48 that receive the buffered clock signal CLK from the clock network 42.

The clock network 42 also includes a low power clock gating circuit (LPCG) 50. The LPCG 50 receives the clock signal CLK from an external circuit such as a clock generator (not shown) and receives an enable signal EN from a clock or power control module (not shown). The LPCG 50 enables the clock signal CLK to be passed to the clock buffer circuits 46. The LPCG 50 may be formed from logic gates, such as an AND gate, as will be understood by those of skill in the art. The use of an enable signal allows the clock signal to be turned off and not provided to the circuit blocks 44. In such a scenario, when the circuit block 44 does not receive an active clock signal, the circuit block 44 is effectively turned off and thus it does not consume active power.

In one embodiment of the invention, if the circuit block 44 is put in operation and clock signal CLK is therefore necessary to operate the internal circuit elements 48 (operation state), a low enable signal EN is input to the LPCG 50. On the other hand, if the clock signal CLK is not required by the circuit block 44 (e.g., when the internal circuit elements 48 are not being used (standby state)), a high enable signal EN is input to the LPCG 50.

In addition, since the buffer circuits 46a-46e have the circuit structure of the buffer circuit 10 (FIG. 1) discussed above, when the high enable signal EN is provided to the leakage current prevention circuit 14, the first and second PMOS transistors 28 and 30 are turned off so the CMOS transistors 16 and 18 do not receive the voltage signal VDD and thus the CMOS transistors 16 and 18 do not leak, which saves on the leakage component of power.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A clock buffer circuit for use in a clock network, the clock buffer circuit consisting essentially of:
   a clock driver circuit that receives an input signal and outputs a buffered signal, the clock driver circuit consisting of:
      a first CMOS transistor, connected between a power supply line and a ground line, that receives the input signal; and
      a second CMOS transistor, connected between the power supply line and the ground line, and to the first CMOS transistor, wherein the second CMOS transistor receives the input signal from the first CMOS transistor and generates the buffered signal;
   a leakage current prevention circuit for disconnecting the first and second CMOS transistors from the power supply line, the leakage current prevention circuit consisting of:
      a first PMOS transistor connected between a source of a PMOS transistor in the first CMOS transistor and the power supply line, wherein a gate of the first PMOS transistor receives an enable signal; and
      a second PMOS transistor connected between a source of a PMOS transistor in the second CMOS transistor and the power supply line, wherein a gate of the second PMOS transistor receives the enable signal; and
      wherein, the widths and lengths of the first and the second PMOS transistors are predefined such that the addition of these transistors in series to the first and second CMOS transistors does not increase the activation time of the first and second CMOS transistors, and
      wherein the first and second PMOS transistors are deactivated in response to the enable signal thereby disconnecting the first and second CMOS transistors from the power supply line; and
   an output stabilization holding transistor, connected between an output terminal of the second CMOS transistor and the ground line, and receiving the enable signal, wherein when the output stabilization holding transistor receives the enable signal, the output of the second CMOS transistor is held at ground level.

2. The clock buffer circuit of claim 1, wherein disconnecting the first and second CMOS transistors from the power supply line when the enable signal is active prevents the first and second CMOS transistors from leaking current, thereby saving power.

3. The clock buffer circuit of claim 1, wherein the output stabilization holding transistor comprises an NMOS transistor having a drain connected to the output terminal of the second CMOS transistor, a source connected to the ground line GND, and a gate that receives the enable signal EN.

4. The clock buffer circuit of claim 3, wherein the NMOS transistor of the output stabilization holding transistor has a small driving capacity.

* * * * *